United States Patent

[11] 3,549,958

[72] Inventor David H. Margolien
Lexington, Mass.
[21] Appl. No. 726,399
[22] Filed May 3, 1968
[45] Patented Dec. 22, 1970
[73] Assignee Unitrode Corporation
Watertown, Mass.
a corporation of Maryland

[54] HIGH POWER STUD MOUNTED DIODE
8 Claims, 5 Drawing Figs.

[52] U.S. Cl. ........................................................ 317/234, 317/235
[51] Int. Cl. ........................................................ H01l 3/00, H01l 5/00
[50] Field of Search ............................................ 317/234, 235, (1), (3), (4), (4,1), (5)

[56] References Cited
UNITED STATES PATENTS

| | | | |
|---|---|---|---|
| 3,193,366 | 7/1965 | Clark | 317/234 |
| 3,274,456 | 9/1966 | Dittler et al. | 317/234 |
| 3,280,390 | 10/1966 | Rossle et al. | 317/234 |
| 3,283,224 | 11/1966 | Erkan | 317/234 |
| 3,296,501 | 1/1967 | Moore | 317/234 |
| 3,311,798 | 3/1967 | Gray | 317/234 |
| 3,361,868 | 1/1968 | Bachman | 317/234 |
| 3,375,417 | 3/1968 | Hull et al. | 317/234 |
| 3,414,968 | 12/1968 | Genser et al. | 317/234 |
| 3,417,300 | 12/1968 | Kauffman | 317/234 |
| 3,449,640 | 6/1969 | Franklin | 317/234 |

*Primary Examiner*—John W. Huckert
*Assistant Examiner*—Andrew J. James
*Attorney*—Joseph Weingarten

ABSTRACT: A high-power semiconductor diode in which an axially configured diode structure having effective thermal dissipation properties is mounted on a thermally massive structure which does not affect the electrical function of the diode terminals. The diode is rigidly mounted to a threaded stud by means of an electrically insulative body of high thermal conductivity to provide an efficient thermal mounting for the diode without affecting the electrical performance thereof.

PATENTED DEC 22 1970

3,549,958

INVENTOR.
DAVID H. MARGOLIEN
BY Joseph Weingarten
Stanley M. Schurgin
ATTORNEYS

HIGH POWER STUD MOUNTED DIODE

FIELD OF THE INVENTION

This invention relates to semiconductor devices and more particularly to high-power semiconductor diode packages.

BACKGROUND OF THE INVENTION

Semiconductor diodes are limited in their power handling capacity primarily by their ability to dissipate heat generated during operation. Thus, with the exception of diodes designed for extremely low-power functions, some arrangement is usually provided to dissipate the heat loss of the device in the environment in which it is to operate.

A well-known expedient is to provide a finned structure which enhances convection cooling. In some instances air is mechanically circulated over these "radiators" to further increase the dissipation of heat energy. Another example of a high-power diode package is one which includes a conductive metal stud as one electrical terminal. In practice this stud is bolted to the chassis of the electrical equipment with the result that the thermal losses are, with reasonable effectiveness, conducted into the relatively massive chassis for cooling. Heat dissipation may be even further enhanced by combining the aforementioned techniques and providing the bolted diode with an arrangement of radiating fins to take advantage of convection cooling.

It is, of course, apparent from the foregoing discussion that such conventional diodes are limited in application to electrical configurations which permit one terminal to be chassis-connected, or grounded. Where, however, both terminals of the diode are by virtue of the circuit requirements "live," thermal dissipation through the chassis is not easily accomplished. It is often inconvenient to mechanically support conventional diode packages in a thermally efficient manner in those instances where electrical isolation between the chassis and the diode is required. Convection devices enhance heat dissipation to some extent, but circuit arrangements, which include diodes operating under such circumstances, are often unduly bulky due to the large open spaces required to avoid excessive temperatures. The problems associated with conventional high-power diodes are overcome in accordance with the present invention through the provision of a novel structure which utilizes certain inherent properties of a specialized diode structure to enhance thermal dissipation while maintaining high standards of electrical performance.

SUMMARY OF THE INVENTION

In brief, the invention comprises an axially configured semiconductor diode which itself has extremely good thermal dissipation properties mounted on a thermally massive structure which does not interfere with the electrical function of the diode terminals. The diode is rigidly mounted with one of its terminals connected to a threaded stud by means of an electrically insulative body of high thermal conductivity. Electrical connection to the diode terminals is made by leads extending from the axial diode structure and suitably connected to the diode terminals, the leads being designed to allow versatile electrical interconnection of the diode within an accompanying circuit. The threaded stud can be secured to a thermally massive structure such as a chassis or other heat dissipating surface to provide efficient thermal mounting for the diode without affecting the electrical performance thereof.

A typical axial diode structure comprises a PN junction formed in a cylindrical wafer of semiconductor material, the wafer being bonded on its respective opposite cylindrical surfaces to cylindrical metal studs of substantially the same diameter as the semiconductor wafer. The semiconductor junction formed in the wafer extends to the circumferential edge of this wafer; thus, the junction has a relatively large, generally circular area and the coextensive metal studs bonded thereto provide an efficient thermal structure for the removal of heat from the junction. To protect the exposed edge of the semiconductor junction, a coating of glass or other suitable material is formed around this exposed edge and over adjoining portions of the metal studs to protect the rectifying junction. The metal cylindrical studs are intimately bonded to the semiconductor wafer to form a unitary axial structure. A diode of this construction has an extremely effective thermal dissipation path along the axis of the device.

Electrical connection can be made to the diode by means of a pair of ribbon leads each of which is affixed to respective ones of the stud terminals. Each lead has an enlarged portion with a hole therethrough dimensioned to fit over the end of the stud terminal and to be electrically and mechanically secured thereto for example by brazing. The ribbon leads extend radially from the diode but are sufficiently flexible to allow bending in any desired position to allow interconnection in a circuit in which the diode is employed. Alternatively, a flexible lead can be affixed to the outer stud terminal and can extend axially of the diode.

In order to permit the efficient dissipation of heat generated within the semiconductor junction without affecting the electrical operation of the diode, one of the stud terminals is intimately bonded to a highly thermally conductive and electrically insulative body of material preferably having a larger surface area than the stud terminal. In the present context, the term highly thermally conductive means thermal conductivities comparable to those of metals. Typical electrically insulative but thermally conductive materials useful in the invention are ceramics such as alumina and beryllia. The thermally conductive body on one surface of which is bonded the metal stud of the diode structure is, in turn, intimately bonded to a threaded metal stud in such a manner as to provide efficient heat transfer from the thermally conductive body to the metal stud. Typically, the metal stud includes a head integrally formed with a threaded projection, the exposed surface of the head having a recess formed therein dimensioned and configured to receive the electrically insulative thermally conductive body in intimate bonding relation thereto. The bond between the thermally conductive body and the metal stud can be provided by metallizing the portion of the thermally conductive body which is to mate with the stud and to braze the materials together after they are placed in juxtaposition.

In operation, the threaded projection of the metal stud is threaded into a tapped hole in a chassis or other suitable heat dissipating structure, or, alternatively, the threaded portion can be passed through an untapped hole provided in a chassis and secured thereto by a nut. The diode structure is thereby affixed to a larger area heat dissipating surface and the diode structure itself is by its novel construction capable of efficiently dissipating heat generated within the semiconductor axially through the metal stud terminal and thence to the thermally conductive body and thence to the threaded stud for ultimate transmission to the heat sink structure. Electrical connection of the diode in circuit is accomplished via the flexible leads, and it is an important feature of the invention that these leads are electrically isolated from the thermal path. Thus, thermal considerations do not affect the electrical operation of the diode and, conversely, the electrical requirements of a particular diode connection are not affected by thermal considerations. The electrical interconnection of the diode and the thermal mounting of the diode can, therefore, be accomplished without the necessity, as is often the case with conventional diode structures, of balancing competing interests between desired electrical and thermal properties.

DESCRIPTION OF THE DRAWINGS

The invention will be more fully understood from the following detailed description, taken in conjunction with the accompanying drawings, in which.

DETAILED DESCRIPTION OF THE INVENTION

Figures 1, 2, 4:
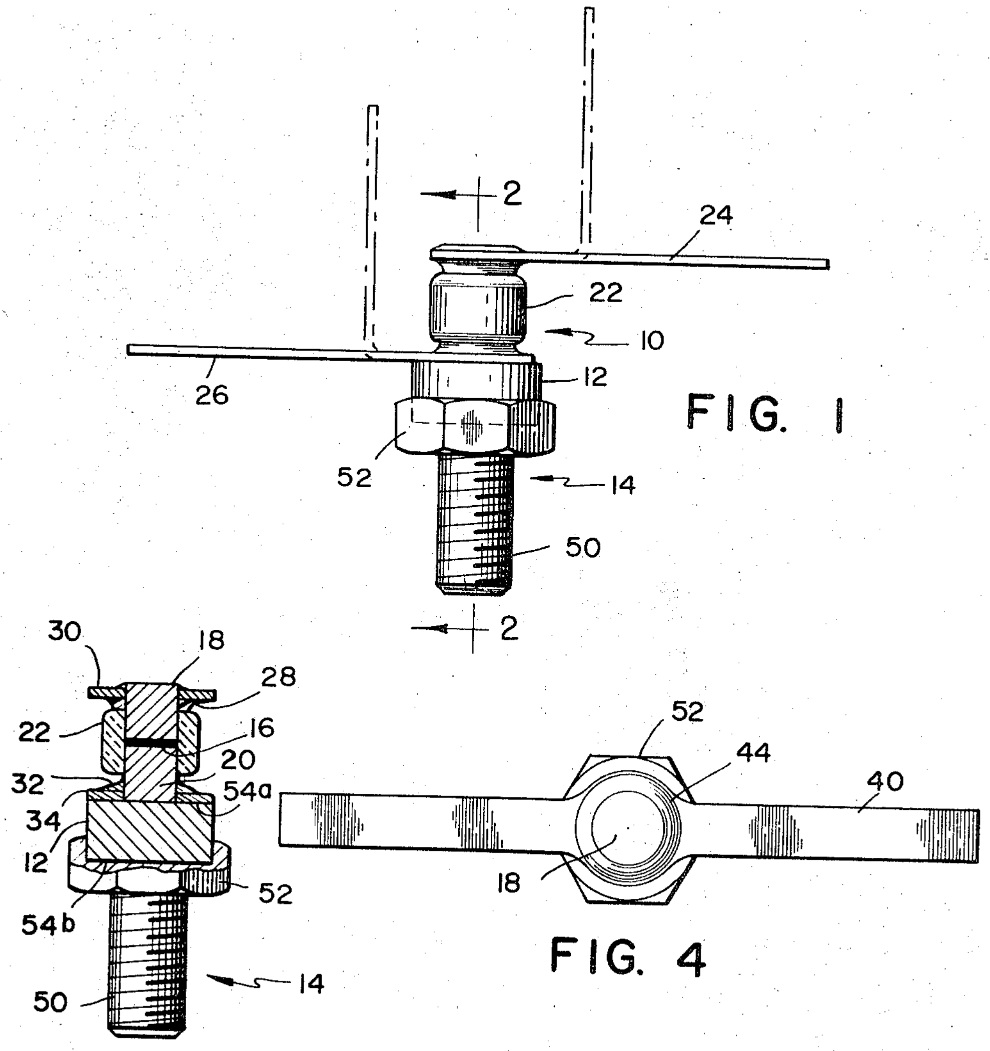
FIG. 1 is an elevation view of a diode embodying the present invention.
FIG. 2 is a sectional elevation view taken along lines 2–2 of FIG. 1 of a diode according to the invention.
FIG. 4 is a top view of the embodiment of FIG. 3.

Referring to FIGS. 1 and 2, there is shown a semiconductor diode 10 mounted on an electrically insulative thermally conductive body 12 which, in turn, is attached to a threaded stud mount 14. The diode, which is of the type described in U.S. Pat. No. 3,200,310, includes a cylindrical wafer of silicon 16 in which is formed a PN junction. The PN junction formed in the wafer extends to the circumferential periphery of the wafer and the junction thus effectively has a large internal, generally circular area. First and second molybdenum stud terminals 18 and 20 are bonded to respective opposite faces of semiconductor body 16. The stud terminals are cylindrical and are dimensioned to be of substantially the same diameter as that of silicon wafer 16. The silicon wafer is metallurgically bonded to the pair of axially disposed stud terminals to provide a unitary axial structure which is mechanically rugged as well as being thermally efficient. The exposed circumferential edge of the semiconductor junction is protected by a sleeve of glass 22 which is fused around the edges of the silicon wafer 16 and the adjacent portions of the stud terminals 18 and 20. The diode structure, including stud terminals 18 and 20, the silicon wafer 16 and the surrounding glass sleeve 22, are intimately bonded into a solid mechanical structure which is extremely rugged and which provides a highly conductive thermal path axially of the device. Thus, heat generated within the semiconductor junction is conducted via the stud terminals 18 and 20 axially away from the junction.

The diode is fabricated by bonding the stud terminals to respective opposite faces of the silicon wafer by means of a bonding layer fusing at above 700°C., enclosing the circumferential edge of the wafer and the adjacent portions of the stud terminals with glass having a coefficient of thermal expansion substantially matching that of the wafer and the stud terminals, and heating the assembly to a temperature above the softening point of the glass until the glass has fused into direct contact with the wafer and the stud terminals. Most conveniently, the bonding of the glass to the stud terminals is accomplished by enclosing the circumferential edge of the wafer and the adjoining portions of the stud terminals in a tubular sleeve of glass and heating the sleeve to a temperature above its softening point until it has fused into glass-to-metal sealed relation with the stud terminals and preferably into direct contact with the circumferential edge of the semiconductor wafer.

Electrical connection is made to the diode via ribbon leads 24 and 26 which are mechanically and electrically connected to respective stud terminals 18 and 20. Ribbon leads 24 and 26 are formed of thin strips of nickel and one end of each of these ribbon leads has an enlarged end portion with a hole formed therein dimensioned and configured to fit over the outer end of stud terminals 18 and 20. As illustrated in FIG. 2, ribbon leads are secured to respective stud terminals by means of preformed brazing rings. A brazing ring 28 is inserted over stud terminal 18 and the enlarged portion 30 of ribbon lead 24 is placed over stud terminal 18 in contact with ring 28. Similarly, a second brazing ring 32 is inserted over stud terminal 20 and the enlarged portion 34 of ribbon lead 26 is placed over this stud terminal in contact with ring 32. The assembly is heated in a furnace at a temperature sufficient to cause the brazing material to flow thereby affecting a good mechanical and electrical bond between the stud terminals and their respective ribbon leads. As seen in FIG. 2, ring 28 is shown after it has been heated and it is seen that its melting and subsequent fusion has formed a miniscus between the lower surface of ribbon lead portion 30 and glass bead 22. By capillary action a slight amount of brazing material flows between the enlarged portion 30 and stud terminal 18 to form a slight miniscus near the top edge of this terminal. The lower brazing ring 32 is seen to have been caused to flow between the cylindrical wall of stud terminal 20 and the surface of ribbon lead portion 34. The bonding of the ribbon leads to the diode stud terminals can be accomplished at the present juncture in the diode fabrication process, or bonding can be accomplished later in the process together with the mounting of the diode structure on its stud mount.

Figure 3:
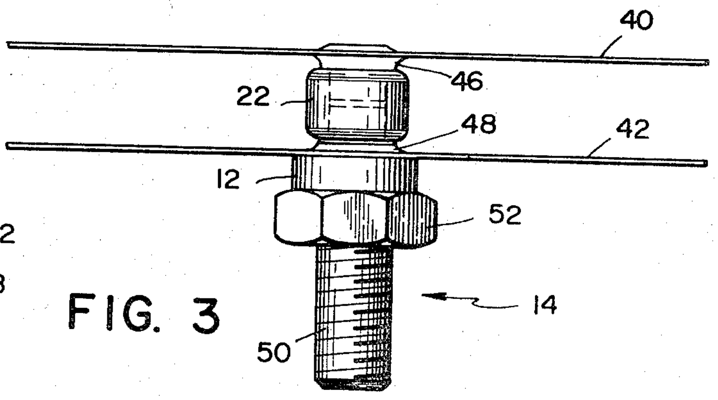
FIG. 3 is an elevation view of an alternative embodiment of the invention.

As is evident from FIG. 1, ribbon leads 24 and 26 extend radially from the cylindrical diode structure; however, these ribbon leads are bendable to any desired position to allow their interconnection with an accompanying circuit. For example, the ribbon leads can be bent to a position parallel to the axis of the diode as illustrated in dotted outline in FIG. 1. Of course the ribbon leads can be bent to any other position, as desired to suit particular interconnection requirements. An alternative electrical lead configuration is illustrated in FIGS. 3 and 4, wherein first and second ribbon leads 40 and 42 are illustrated as being mounted at their midpoints to the respective diode stud terminals, and which extend radially from the diode in opposite directions. The central portion of each ribbon lead 40 and 42 is enlarged to form a circular mounting pad 44 having a hole therethrough dimensioned to fit over respective stud terminals. As in the embodiment described hereinabove, ribbon lead 40 is secured to stud terminal 18 by means of a preformed brazing ring 46, while ribbon lead 42 is secured to stud terminal 20 by means of a brazing ring 48. As before, brazing ring 46 is inserted over the upper end of stud terminal 18 and the ribbon lead 40 is inserted with its central hole over the end of stud terminal 18, the enlarged portion 44 engaging the upper surface of ring 46. Lower brazing ring 48 is inserted over the free end of stud terminal 20 and the ribbon lead 42 is similarly inserted over the stud terminal in engagement with ring 48. The diode assembly is again heated to a temperature sufficient to affect a bond between the ribbon leads and their respective stud terminals. In this latter embodiment, the ribbon leads extend from the device in two directions. Both ends of each ribbon lead may be employed for interconnection of the diode in circuit as the situation may require, or one end which is not needed in a particular instance can be cut off, leaving a single radial lead such as shown in FIG. 1. Thus, a variety of interconnection configurations is possible by the provision of the doubly extending leads. Also, the provision of the doubly extending leads as shown in FIG. 3 allows the manufacturer to provide a single electrical terminal configuration which may be suitably tailored to individual needs by the customer. In this manner it is not necessary to manufacture and stock essentially the same semiconductor device having different lead configurations, as this doubly extending lead configuration meets many of the electrical terminal configuration requirements which would likely be needed.

Figure 5:
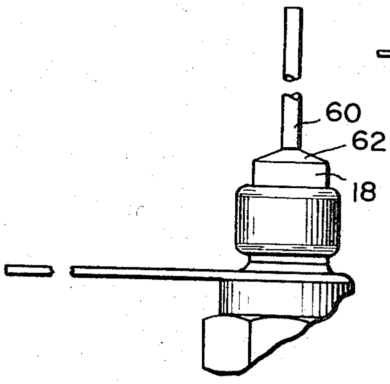
FIG. 5 is a partial elevation view of a further embodiment of the invention.

A further alternative electrical lead configuration is illustrated in FIG. 5, wherein the upper lead 60 is affixed to stud terminal 18 and extends axially of the diode. Lead 60 is typically made of nickel wire and has a generally circular head portion 62 which is brazed to the circular surface of stud terminal 18. As before, lead 60 is flexible to permit bending to any desired position for interconnection in circuit.

According to the present invention, the diode structure described thus far is mounted on a threaded stud in a thermally efficient manner which does not adversely affect the electrical operation of the device. Referring once again to FIGS. 1 and 2, there is shown the stud terminal 20 bonded to the upper surface of a cylindrical beryllia body 12 which, in turn, is intimately bonded to threaded metal stud mount 14. Stud mount 14 is made of copper and includes a threaded projection 50 integrally formed with and depending from a hex head 52. A cylindrical recess is formed in the upper surface of head 52 to accommodate the body 12, as will be further explained hereinbelow. Beryllia body 12 is metallized with a coating of brazing material 54*a* formed on the upper surface thereof and a second layer of brazing material 54*b* is also formed on the lower surface of body 12 and may extend partially up the cylindrical wall of this body. In practice, the metallization of the intended surfaces of beryllia body 12 may be accomplished by fully metallizing the exposed surfaces of the body and then selectively removing the metallized material in those regions where it is not needed. Thus, in the illustrated embodiment, the top and bottom surfaces of body 12 can be metallized with a suitable braze coating, or the cylindrical surface can also be metallized and a portion of the brazing material on the cylindrical surface of the body can be removed, thereby leaving the metallized surface 54*a*, and the metallized layer 54*b* on the lower surface of body 12 and on the adjacent lower portion of the cylindrical wall of body 12 which is to fit within the recess in head 52.

Body 12 is dimensioned to precisely fit within the recess provided in head 52. After insertion of body 12 into the recess in head 52, these parts are heated to affect an intimate bond between the metallized mating surfaces, thereby to provide an effective mechanical and thermal connection between the two elements. The diode structure is mounted on the top surface of body 12 by placing the exposed face of stud terminal 20 and its associated ribbon lead onto metallized surface 54*a* of body 12. The enlarged portion 34 of ribbon lead 20 is dimensioned to be substantially coextensive with the upper surface of body 12 and a bond is affected by heating the structure to affect an intimate bond between the mating surfaces. As mentioned hereinabove, the individual diode structure may be bonded in a separate operation, or the entire diode assembly may be bonded in one furnace operation to effectively fuse all mating surfaces.

It is seen that an axial structure is provided wherein the unitary diode assembly is intimately bonded via stud terminal 20 to beryllia body 12 and thence to stud mount 14, which then transmits the dissipated heat to a heat sink structure such as a chassis in which the threaded projection 50 is secured. It will be noted that the area of the stud terminals 18 and 20 is coextensive with the large area of the semiconductor junction of wafer 16. Furthermore, the area of beryllia body 12 is greater than the area of stud terminal 20 and the area of head 52 is greater than body 12. Thus, the large area bonding and the axial construction permits the extremely efficient conduction of heat from the semiconductor junction to a heat dissipating structure.

In operation, the threaded projection 50 of stud mount 14 is threaded into a tapped hole provided in a chassis or other heat dissipating structure, or, alternatively, the threaded projection 50 can be passed through an untapped hole provided in such chassis and secured thereto by a nut threaded onto the opposite side of the chassis. The stud mount 14 is thereby strongly attached to a chassis or other mounting structure and this stud mount is also in intimate thermal contact with this mounting structure. The diode itself is electrically isolated from the thermal mount by reason of the electrically insulative properties of beryllia body 12; thus, the diode can be connected in circuit without concern for those considerations governing the thermal mounting of the diode. Electrical interconnections need not, therefore, be altered merely to suit thermal requirements, as is often the case with conventional high-power diodes. The flexibility of the ribbon leads allows facile and versatile interconnection of the diode to surrounding points in an associated circuit, while the rugged and thermally efficient construction of the diode structure allows extremely effective heat dissipation from the semiconductor junction, with this thermally efficient assembly in no way forming a part of the electrical circuit.

Various modifications and alternative implementations of the invention will occur to those versed in the art. For example, it is evident that the beryllia body 12 need not be circular in configuration, but can be of any other shape as may suit a particular instance. Similarly, body 12 can also be made of other electrically insulative and thermally conductive materials such as other ceramics and glasses. In addition, stud mount 14 can be made of a variety of thermally conductive materials and it is of course evident that the head portion of the stud mount need not be limited to a hexagonal configuration. Accordingly, it is not intended to limit the invention by what has been particularly shown and described except as indicated in the appended claims.

I claim:

1. A high-power semiconductor diode comprising:

a diode having a cylindrical semiconductor wafer with a large area PN junction formed therein and extending to the circumferential edge of the wafer, first and second electrically and thermally conductive cylindrical stud terminals coextensive with said wafer and metallurgically bonded to respective opposite surfaces thereof and extending axially therefrom, and a protective coating of material intimately fused around the exposed circumferential edge of said wafer and over adjacent portions of said stud terminals to provide a unitary axial diode structure having a highly effective thermal dissipation path axially from said wafer;

first and second electrically conductive leads each being mechanically and electrically attached to a respective one of said stud terminals and each extending from said axial diode structure, at least one of said leads being of ribbon configuration having an enlarged portion with a hole therein dimensioned to fit over the end of a stud terminal, said enlarged portion being bonded to said stud terminal;

a thermally massive stud mount having a threaded projection integrally formed with and depending axially from a head, said head having a recess formed in the upper surface thereof; and a highly thermally conductive electrically insulative body of a width substantially coextensive with the enlarged portion of said ribbon lead and said recess and of a height greater than said recess, one surface of said body being intimately bonded to the stud terminal and enlarged portion of the lead associated therewith, and the opposite surface being intimately bonded within said recess to said stud mount, thereby to provide an electrically isolated efficient thermal dissipation path from said semiconductor wafer to said stud mount.

2. A high-power semiconductor diode according to claim 1 wherein said head has a cylindrical recess formed in the upper surface thereof, and said thermally conductive electrically insulative body is a ceramic of cylindrical configuration, dimensioned in diameter to intimately fit within said recess and in height to extend axially beyond said head.

3. A high-power semiconductor diode according to claim 2 wherein a surface of said ceramic body lying within said recess is metallized with a brazing metal, and the surface on which said stud terminal is mounted is metallized with a brazing metal, thereby to provide a thermally efficient bond between said body, said stud terminal and said thermally massive mount.

4. A high-power semiconductor diode according to claim 3 wherein said ceramic body is beryllia.

5. A high-power semiconductor diode according to claim 1 wherein said first and second electrically conductive leads each are of ribbon configuration and having an enlarged portion with a hole therein dimensioned to fit over the end of a respective stud terminal and intimately bonded thereto.

6. A high-power semiconductor diode according to claim 5 wherein the enlarged portion of each of said ribbon leads is on one end thereof.

7. A high-power semiconductor diode according to claim 1 wherein the enlarged portion of each of said ribbon leads is at a position approximately midway of the length of said ribbon leads and said ribbon leads each extend radially from said axial diode structure in opposite directions.

8. A high-power semiconductor diode according to claim 1 wherein said first lead is of ribbon configuration and extends radially from said axial diode structure, and said second lead is of cylindrical configuration and extends axially from said axial diode structure.